United States Patent
Cao (10) Patent No.: US 12,386,266 B2
(45) Date of Patent: Aug. 12, 2025

(54) METHOD OF PROCESSING PHOTORESIST LAYER, AND PHOTORESIST LAYER

(71) Applicant: CHANGXIN MEMORY TECHNOLOGIES, INC., Hefei (CN)

(72) Inventor: Kanyu Cao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 607 days.

(21) Appl. No.: 17/814,025

(22) Filed: Jul. 21, 2022

(65) Prior Publication Data
US 2023/0185194 A1 Jun. 15, 2023

Related U.S. Application Data

(63) Continuation of application No. PCT/CN2022/092033, filed on May 10, 2022.

(30) Foreign Application Priority Data

Dec. 13, 2021 (CN) .......................... 202111516517.2

(51) Int. Cl.
*G03F 7/38* (2006.01)
*G03F 7/004* (2006.01)
(Continued)

(52) U.S. Cl.
CPC .............. *G03F 7/38* (2013.01); *G03F 7/0045* (2013.01); *G03F 7/039* (2013.01); *G03F 7/094* (2013.01);
(Continued)

(58) Field of Classification Search
CPC . G03F 7/094; G03F 7/095; G03F 7/38; G03F 7/42
See application file for complete search history.

(56) References Cited

U.S. PATENT DOCUMENTS 6,797,456 B1 9/2004 Gu et al.
7,781,150 B2 8/2010 Chen
(Continued)

FOREIGN PATENT DOCUMENTS

CN 1472599 A 2/2004
CN 101206407 A 6/2008
(Continued)

OTHER PUBLICATIONS

International Search Report cited in PCT/CN2022/092033 mailed Aug. 31, 2022, 10 pages.

*Primary Examiner* — Amanda C. Walke
(74) *Attorney, Agent, or Firm* — Syncoda LLC; Feng Ma (57) ABSTRACT

The present disclosure relates to the technical field of semiconductors, and provides a method of processing a photoresist layer, and a photoresist layer. The method of processing a photoresist layer includes: forming a photoresist layer on a target layer, where the photoresist layer includes a first part away from the target layer and a second part close to the target layer; processing the photoresist layer by using a first process, such that a light absorption rate of the first part is less than a light absorption rate of the second part; performing first exposure processing on the photoresist layer to form an exposure image in the second part; and stripping the first part and performing first development processing on the photoresist layer, to pattern the second part into a photoresist pattern.

16 Claims, 5 Drawing Sheets

(51) Int. Cl.
  *G03F 7/039* (2006.01)
  *G03F 7/09* (2006.01)
  *G03F 7/11* (2006.01)
  *G03F 7/16* (2006.01)
  *G03F 7/42* (2006.01)

(52) U.S. Cl.
  CPC ............... *G03F 7/11* (2013.01); *G03F 7/167* (2013.01); *G03F 7/42* (2013.01)

(56) References Cited

U.S. PATENT DOCUMENTS

| | | | |
|---|---|---|---|
| 8,252,511 B2 * | 8/2012 | Nishikawa | G03F 7/095 |
| | | | 430/273.1 |
| 8,841,058 B2 * | 9/2014 | Chang | G03F 7/0046 |
| | | | 430/913 |
| 9,256,128 B2 * | 2/2016 | Chang | H01L 21/31133 |
| 9,543,147 B2 * | 1/2017 | Liu | G03F 7/091 |
| 9,864,275 B2 * | 1/2018 | Chang | G03F 7/168 |
| 2010/0178619 A1 | 7/2010 | Huang et al. | |
| 2015/0241773 A1 * | 8/2015 | Robinson | G03F 7/2024 |
| | | | 430/285.1 |
| 2021/0341835 A1 * | 11/2021 | Theis | G03F 7/0041 |
| 2023/0187207 A1 * | 6/2023 | Cao | G03F 7/095 |
| | | | 430/323 |

FOREIGN PATENT DOCUMENTS

| | | | |
|---|---|---|---|
| CN | 103365092 A | | 10/2013 |
| KR | 20020002166 A | * | 1/2002 |
| TW | I621921 B | | 4/2018 |

* cited by examiner

METHOD OF PROCESSING PHOTORESIST LAYER, AND PHOTORESIST LAYER

CROSS-REFERENCE TO RELATED APPLICATIONS

This is a continuation of International Application No. PCT/CN2022/092033, filed on May 10, 2022, which is based on and claims the priority to Chinese Patent Application No. 202111516517.2, titled "METHOD OF PROCESSING PHOTORESIST LAYER, AND PHOTORESIST LAYER" and filed on Dec. 13, 2021. The entire contents of International Application No. PCT/CN2022/092033 and Chinese Patent Application No. 202111516517.2 are incorporated herein by reference.

TECHNICAL FIELD

The present disclosure relates to, but is not limited to, a method of processing a photoresist layer, and a photoresist layer.

BACKGROUND

As one of the most important process steps in the manufacturing of integrated circuits (ICs), the photolithography process is used to form a desired pattern on a semiconductor substrate. With the development of the IC process and the shrinking of critical dimensions of semiconductor components, the photolithography process is required to have higher precision.

SUMMARY

An overview of the subject matter detailed in the present disclosure is provided below, which is not intended to limit the protection scope of the claims.

The present disclosure provides a method of processing a photoresist layer, and a photoresist layer.

According to a first aspect, the present disclosure provides a method of processing a photoresist layer. The method of processing a photoresist layer includes:
  forming a photoresist layer on a target layer, where the photoresist layer includes a first part away from the target layer and a second part close to the target layer;
  processing the photoresist layer by using a first process, such that a light absorption rate of the first part is less than a light absorption rate of the second part;
  performing first exposure processing on the photoresist layer, and forming an exposure image in the second part; and
  stripping the first part and performing first development processing on the photoresist layer, to pattern the second part into a photoresist pattern.

According to a second aspect, the present disclosure provides a photoresist layer covering a target layer, where the photoresist layer includes a first part away from the target layer and a second part close to the target layer, and a light absorption rate of the first part is less than that of the second part.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
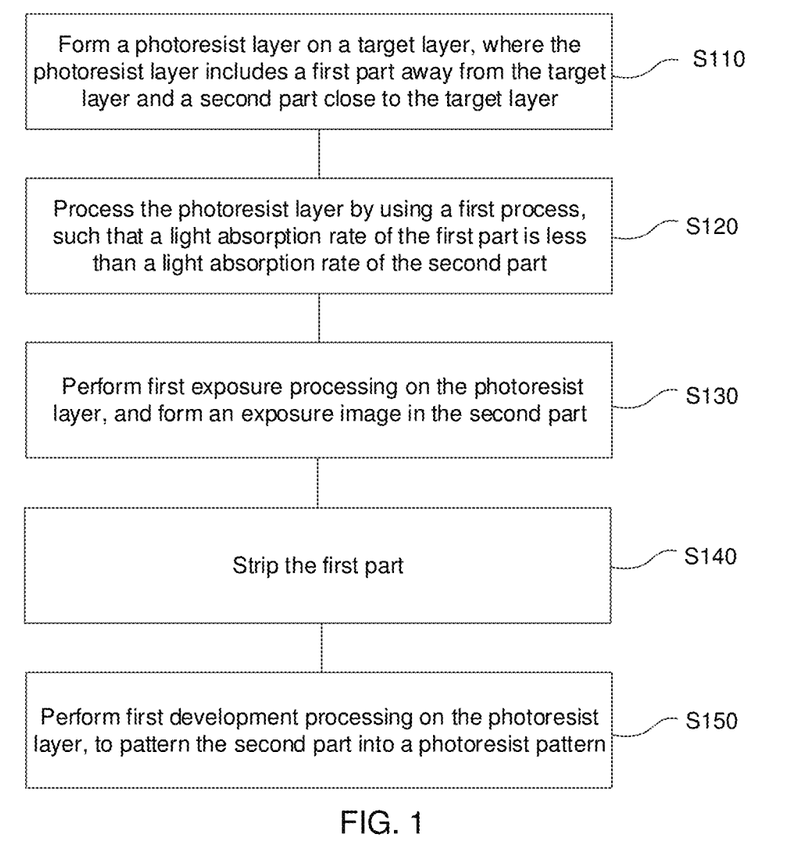
FIG. 1 is a flowchart of a method of processing a photoresist layer according to an exemplary embodiment.

An exemplary embodiment of the present disclosure provides a method of processing a photoresist layer, as shown in FIG. 1. FIG. 1 is a flowchart of a method of processing a photoresist layer according to an exemplary embodiment of the present disclosure. FIG. 4 to FIG. 13 are schematic diagrams of various stages of the method of processing a photoresist layer. The method of processing a photoresist layer is described below with reference to FIG. 4 to FIG. 13.

As shown in FIG. 1, an exemplary embodiment of the present disclosure provides a method of processing a photoresist layer. The method includes:

Step S110: Form a photoresist layer on a target layer, where the photoresist layer includes a first part away from the target layer and a second part close to the target layer.

In the process of forming the photoresist layer 1, the target layer 2 is coated with a photoresist solution, where the photoresist solution includes a photo-acid generator (PAG), a polymer resin, and an organic solvent. Pre-baking (that is, soft baking) is performed on the target layer 2 coated with the photoresist solution. A part of the photoresist solution escapes under heat, and the content of the organic solvent of the photoresist solution is reduced, thus forming the photoresist layer 1, as shown in FIG. 4.

The target layer refers to a to-be-etched material layer that needs to be patterned. The target layer may be a semiconductor substrate or a semiconductor material layer for forming semiconductor elements, for example, a dielectric layer or a metal layer. A material of the semiconductor substrate may be silicon (Si), germanium (Ge), silicon-germanium (GeSi), or silicon carbide (SiC); or may be silicon on insulator (SOI) or germanium on insulator (GOI); or may be another material such as gallium arsenide or other III-V compounds. The semiconductor substrate may be doped with certain impurity ions as required, and the impurity ions may be N-type impurity ions or p-type impurity ions. The semiconductor material layer may be an amorphous carbon layer, an oxide layer, a nitride layer, a copper layer, a tungsten layer, an aluminum layer, or the like, but is not limited thereto.

In some embodiments, during pre-baking, the target layer 2 coated with the photoresist solution may be baked in an environment at a temperature of 80° C. to 110° C. for 50 seconds to 80 seconds.

Figure 4:
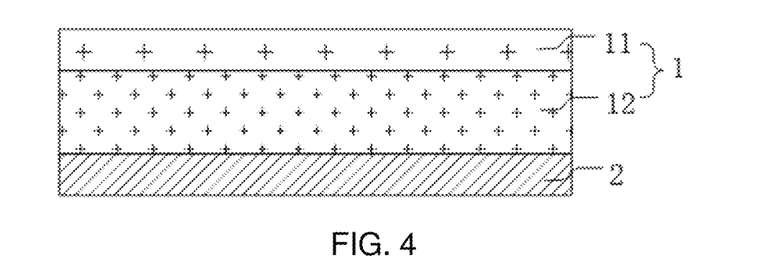
FIG. 4 is a schematic structural diagram of a photoresist layer according to an exemplary embodiment.

In some embodiments, referring to FIG. 4, the formed photoresist layer 1 is a positive photoresist layer. The positive photoresist layer does not dissolve in the developing agent before having a photochemical reaction. The dissolution characteristic of the positive photoresist layer is changed after the photochemical reaction, such that the positive photoresist layer can dissolve in the developing solution.

Step S120: Process the photoresist layer by using a first process, such that a light absorption rate of the first part is less than a light absorption rate of the second part.

Referring to FIG. 4, the photoresist layer 1 is processed by using the first process, to reduce the light absorption rate of the first part 11 and/or improve the light absorption rate of the second part 12. After the first process, the light absorption rate of the first part 11 is less than the light absorption rate of the second part 12.

It may be understood that, the light absorption rate of the first part 11 and the light absorption rate of the second part 12 may refer to relative light absorption rates of the two parts; the light absorption rate of the first part 11 and the light absorption rate of the second part 12 may also refer to comprehensive light absorption rates of the two parts respectively. For example, along a light incidence direction, the light absorption rate of the photoresist layer may increase gradually, increase stepwise, increase in a jumping manner, or increase in other manners.

Step S130: Perform first exposure processing on the photoresist layer, and form an exposure image in the second part.

Figure 5:
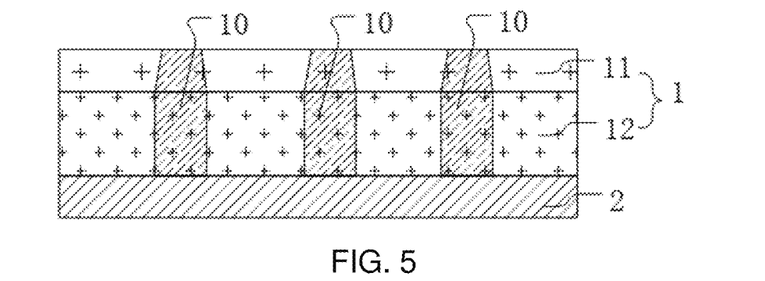
FIG. 5 is a schematic diagram of forming an exposure image through first exposure processing according to an exemplary embodiment.
Figure 9:
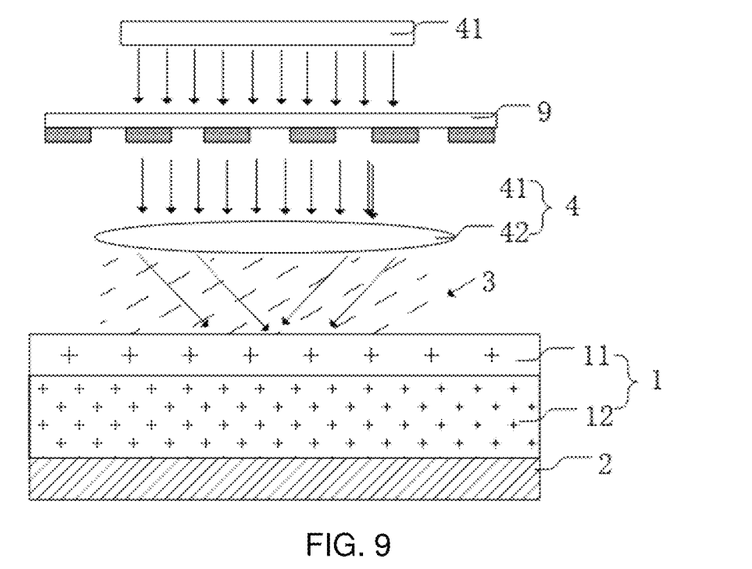
FIG. 9 is a schematic diagram of exposure processing performed by an exposure apparatus on a photoresist layer according to an exemplary embodiment.

As shown in FIG. 5 with reference to FIG. 9, an incident beam is transmitted to the photoresist layer 1. The incident beam passes through the first part 11 to form an exposure image in the second part 12. Meanwhile, the first part 11 is also under the exposure of the incident beam. Due to the different light absorption rates of the first part 11 and the second part 12, when the light absorption rate of the first part 11 is less than the light absorption rate of the second part 12, an exposed region of the first part 11 absorbs less light during the first exposure processing, and the photochemical reaction in the first part 11 is incomplete, resulting in different solubilities of the first part 11 and the second part 12 in the developing solution. The exposure image in the first part 11 has lower resolution than the exposure image in the second part 12.

Step S140: Strip the first part.

Figure 7:
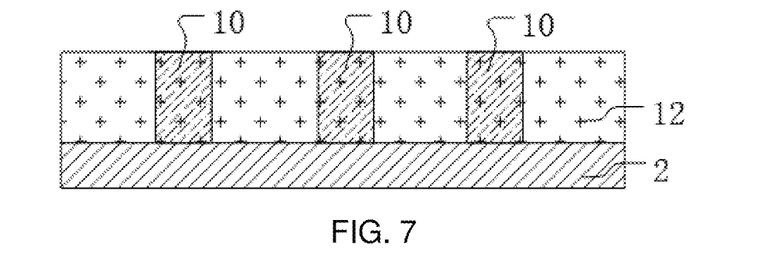
FIG. 7 is a schematic diagram of stripping a first part according to an exemplary embodiment.

As shown in FIG. 7 with reference to FIG. 5, the entire first part 11 is removed from the second part 12, and the exposed region formed in the first part 11 during the first exposure processing is removed accordingly; only the second part 12 and the exposure image in the second part 12 are retained.

In some embodiments, the first development processing can be directly performed on the photoresist layer 1 on which the first exposure processing has been performed. Based on different solubilities of the first part 11 and the second part 12 in the developing solution, a development time is controlled to remove the first part 11 while retaining the second part 12.

Step S150: Perform first development processing on the photoresist layer, to pattern the second part into a photoresist pattern.

Figure 8:
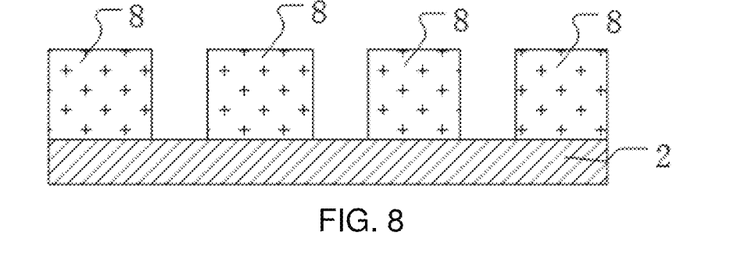
FIG. 8 is a schematic diagram of first development processing according to an exemplary embodiment.

As shown in FIG. 8 with reference to FIG. 7, a first developing solution is sprayed to the second part 12, such that the first developing solution is distributed all over the second is part 12; the second part 12 is fully submerged in the first developing solution. The second part 12 dissolved by the first developing solution is removed, and the retained second part 12 forms a photoresist pattern 8.

In the photolithography process, influenced by the process environment, the concentration of the photo-acid generator is low at the top of the photoresist layer, resulting in an undesired shape of the top of the formed photoresist pattern and affecting the lithographic resolution. In some embodiments, the first part is removed after the exposure image is formed in the second part, to avoid the problem of undesired top shape of the photoresist pattern due to the presence of the first part.

In some embodiments, before the first exposure processing, the second part is processed by using the first process, to improve the light absorption rate of the second part, thereby improving the image quality of the exposure image formed in the second part and improving the lithographic resolution of the second part.

According to an exemplary embodiment, a metal oxide may be added to the photoresist layer to increase the light absorption rate of the photoresist layer. For example, metal oxide nano-particles with a titanium dioxide and hafnium dioxide nano-particle structure are added to the photoresist layer. Moreover, the first process may be performed, such that the concentration of the metal oxide in the second part 12 is greater than the concentration of the metal oxide in the first part 11. The addition of the metal oxide to the photoresist layer can further improve the lithographic resolution and etching resistance of the photoresist layer.

According to an exemplary embodiment, the implementation of step S120 is described. In the implementation process, the processing the photoresist layer by using a first process such that a light absorption rate of the first part is less than a light absorption rate of the second part includes: processing the first part by using the first process, where a photo-acid generator in the first part is reacted to form a photo-acid product, and the processed first part has a lower concentration of the photo-acid generator than the second part.

The photo-acid generator in the photoresist solution decomposes under light exposure to generate acid, and hydrogen ions $H^+$ of the acid can serve as a catalyst to is help unstable groups of the polymer resin in the photoresist solution to fall off. After a sufficient quantity of pendant groups of the polymer resin fall off, the polarity of the polymer resin changes, and the photoresist can dissolve in the developing solution.

In an embodiment, the processing the first part by using the first process includes: implanting amino ions into the first part from a top surface of the photoresist layer, where an implantation depth of the amino ions is a first depth, and the first depth is equal to a thickness of the first part. The photo-acid generator in the first part is neutralized by the amino ions to generate a photo-acid product. The concentration of the photo-acid product in the first part decreases, and the light absorption rate of the first part decreases.

Referring to FIG. 4, the amino ions directly implanted into the first part 11 react quickly with the photo-acid generator, which can quickly reduce the concentration of the photo-acid generator in the first part 11. The photo-acid product produced by the reaction with the photo-acid generator has unstable chemical properties, such that the photo-acid product in the first part 11 can be easily reduced to the photo-acid generator subsequently, thus reducing the processing difficulty of the subsequent second process and making it easy to strip the intact first part 11 from the second part 12.

In another embodiment, the processing the first part by using a first process includes: spraying an alkaline gas to a top surface of the photoresist layer, such that the photo-acid generator in the first part reacts with the alkaline gas to generate the photo-acid product.

In some embodiments, referring to FIG. 4, an alkaline gas is sprayed to the top surface of the photoresist layer 1. The alkaline gas penetrates into the first part 11. The alkaline gas has a neutralization reaction with the photo-acid generator in the first part 11, such that the concentration of the photo-acid product in the first part 11 is reduced, and the light absorption rate of the first part 11 is reduced.

For example, the alkaline may can be ammonia ($NH_3$) or methylamine, dimethylamine, trimethylamine, ethylamine, or the like.

In some embodiments, the neutralization reaction between the alkaline gas and the photo-acid generator lowers the control difficulty of the first process and ensures the control precision of the first process, such that a processing region of the first process is precisely controlled within the first part 11, to avoid the first process from affecting the is second part 12, and ensure that the light absorption rate of the second part 12 is greater than the light absorption rate of the first part 11. The second part 12 has high photosensitivity, ensuring that an exposure image 10 with high precision and high resolution can be formed in the second part 12 through the first exposure processing.

In this embodiment, the first part is processed through the first process, which reduces the concentration of the photo-acid generator in the first part, such that a smaller amount of acid is generated by decomposition of the photo-acid generator in the first part when the first part is under the exposure of the incident beam. Unstable groups of the polymer resin in the first part fall off slowly, thus reducing light absorbed by the first part. A larger amount of the incident beam can pass through the first part and enter the second part, to form the exposure image in the second part, thereby increasing the light utilization.

According to an exemplary embodiment, this embodiment is a description of step S120. In the implementation process, the processing the photoresist layer by using a first process such that a light absorption rate of the first part is less than a light absorption rate of the second part includes: heating the target layer, and heating the photoresist layer through the target layer, such that a temperature of the second part is higher than that of the first part.

In some embodiments, a heat source may be disposed at the bottom of the target layer 2 to radiate thermal energy to the target layer 2. The target layer 2 transfers the thermal energy to the photoresist layer 1. A heating time of the target layer 2 is controlled, to make the temperature of the second part 12 higher than that of the first part 11. As the temperature of the second part 12 rises, the photo-acid generator in the second part 12 has higher chemical activity and a higher chemical reaction speed, such that the light absorption rate of the second part 12 is greater than the light absorption rate of the first part 11.

In some embodiments, during the first exposure processing of the processed photoresist layer, an incident beam enters the second part, the photo-acid generator in the second part decomposes faster to generate acid, and the second part has a higher acid concentration. The exposure image formed in the second part by the incident beam is clearer, and the formed photoresist pattern has higher dimensional precision.

Figure 2:
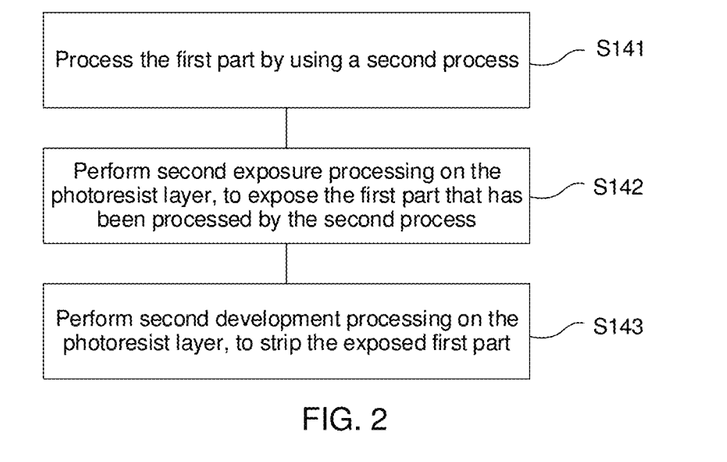
FIG. 2 is a flowchart of stripping a first part in a method of processing a photoresist layer according to an exemplary embodiment.

According to an exemplary embodiment, this embodiment is a description of the implementation of step S140 of the foregoing embodiment. In the implementation process, the stripping the first part includes:

Step S141: Process the first part by using a second process.

Figure 6:
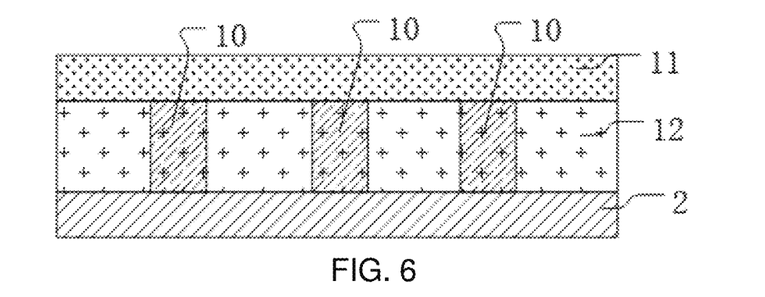
FIG. 6 is a schematic diagram of processing a first part by using a second process according to an exemplary embodiment.

In some embodiments, referring to FIG. 5 and FIG. 6, the second process is a process that can increase the photosensitivity of the first part 11. After the second process, the photosensitivity of the first part 11 is higher than that of the second part 12. The second process may be a process that can increase the concentration of the photo-acid generator in the first part 11 or a process that can increase the concentration of other photosensitive components in the first part 11.

For example, the second process is a process of reducing the photo-acid product in the first part 11 to be a photo-acid generator, or a process of increasing the $H^+$ concentration in the first part 11.

In an embodiment, the processing the first part by using a second process includes: implanting hydrogen ions into the photoresist layer from a top surface of the photoresist layer, where an implantation depth of the hydrogen ions is a second depth, and the second depth is equal to a thickness of the first part. The second depth of implantation of the hydrogen ions into the photoresist layer 1 from the top surface of the photoresist layer 1 may also be greater than the thickness of the first part 11.

In some embodiments, after the hydrogen ions are implanted into the first part 11, the concentration of hydrogen ions in the first part 11 is higher than that in the second part 12. Referring to FIG. 5 and FIG. 6, the implantation of $H^+$ ions can make the $H^+$ concentration of the first part 11 much higher than the $H^+$ concentration of the second part 12, where the $H^+$ is positively correlated with the time it takes to change the polarity of the polymer resin. Therefore, when the photoresist layer 1 is under the exposure of light, pendant groups of the polymer resin in the first part 11 fall off faster than pendant groups of the polymer resin in the second part 12, and it takes a shorter period of time to change the dissolution characteristic of the first part 11 than the dissolution characteristic of the second part 12.

For example, after implantation of $H^+$ ions, the $H^+$ concentration of the first part 11 is 2 times that of the second part 12 or higher. For example, the $H^+$ concentration of the first part 11 may be 2 times, 2.5 times, or 3 times that of the second part 12.

In some embodiments, after the second process, the first part has a high $H^+$ concentration. When the first part is under the exposure of a beam, the highly concentrated $H^+$ ions act on the polymer resin, to cause unstable groups to fall off from the polymer resin in the first part quickly, thus reducing the time for changing the polarity of the polymer resin and the time for changing the dissolution characteristic of the first part. In this way, the first part can be exposed subsequently by controlling exposure light intensity and an exposure time, and then the first part is removed through development processing.

In another embodiment, the processing the first part by using a second process includes: spraying an acid gas to a top surface of the photoresist layer, where the acid gas reduces the photo-acid product in the first part to be the photo-acid generator.

In some embodiments, referring to FIG. 5 and FIG. 6, the acid gas is sprayed to the top surface of the photoresist layer 1. The acid gas penetrates into the first part 11, and the photo-acid product with unstable properties in the first part 11 is reduced by the acid gas to be the photo-acid generator, to increase the concentration of the photo-acid generator in the first part 11. During light exposure, the time for changing the dissolution characteristic of the first part 11 is less than the time for changing the dissolution characteristic of the second part 12.

Meanwhile, a part of the acid gas sprayed to the top surface of the photoresist layer 1 will be dissociated into $H^+$ ions, which increases the $H^+$ concentration in the first part 11. Under light exposure, the first part 11 can further have a photochemical reaction, to reduce the time for changing the polarity of the polymer resin, such that the dissolution characteristic of the first part 11 changes faster.

In some embodiments, the acid gas sprayed to the top surface of the photoresist layer 1 diffuses to the surrounding environment of the photoresist layer 1, to provide an acid process condition for processing the photoresist layer 1. Under the acid condition, the photo-acid reactant is more active, such that the photo-acid generator decomposes more easily under light exposure to generate acid, thus improving the catalytic activity of is the photo-acid generator and causing unstable groups of the polymer resin to fall off more quickly, which makes it easier to strip the first part 11 from the second part 12 subsequently.

The sprayed acid gas may be a hydrogen chloride (HCL) gas or hydrofluoric acid (HF) gas.

In some embodiments, the photo-acid generator is reduced by using the acid gas, which reduces the process control difficulty and achieves high control precision, such that the processing region of the second process can be precisely controlled within the first part, to avoid the second process from affecting the second part. Moreover, in some embodiments, the by-product gas generated by the reaction between the photo-acid product and the acid gas escapes to the process space without contaminating the process environment, thus ensuring the cleanliness of the process environment and preventing the by-product of the reduction reaction from polluting the process environment and affecting the process.

Step S142: Perform second exposure processing on the photoresist layer, to expose the first part that has been processed by the second process.

Referring to FIG. 6, during the second exposure processing of the photoresist layer 1, the exposure intensity and exposure time of the second exposure processing are controlled based on the difference between the light absorption rates of the first part 11 and the second part 12, such that the first part 11 is completely exposed and the second part 12 is not exposed at all. In this way, the first part 11 and the second part 12 after processing have different dissolution characteristics.

Step S143: Perform second development processing on the photoresist layer, to strip the exposed first part.

As shown in FIG. 7 with reference to FIG. 6, the first part 11 is processed using a second developing solution. The first part 11 dissolves in the second developing solution, such that the entire first part 11 is removed. In some embodiments, the concentration of the second developing solution is lower than that of the first developing solution.

In the processing manner of this embodiment, after the first exposure processing, the first part is processed by using the second process, to improve the light absorption rate is of the first part. In this way, under the light exposure, the photochemical reaction in the first part is faster than that in the second part, and it takes a shorter time to change the dissolution characteristic of the first part. By controlling the exposure intensity and the exposure time of the second exposure processing, the first part can be completely exposed, while the second part is not exposed at all, thereby reducing the process difficulty of stripping the first part from the second part.

It should be noted that, in some embodiments, the terms "fist" and "second used in the "first development processing" and "second development processing" do not limit the sequence of the processing, and these terms are only used for distinguishing one process from another.

Figure 3:
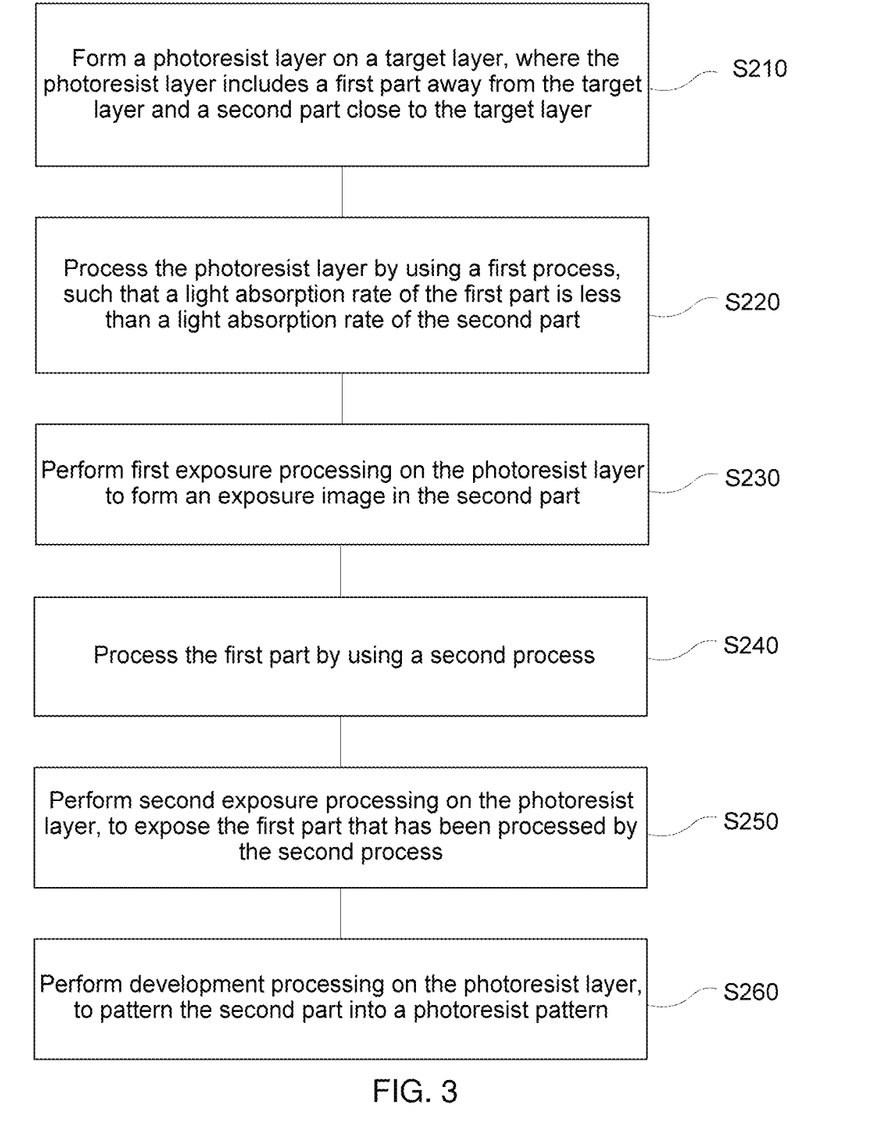
FIG. 3 is a flowchart of a method of processing a photoresist layer according to an exemplary embodiment.

As shown in FIG. 3, an exemplary embodiment of the present disclosure provides a method of processing a photoresist layer. The method includes:

Step S210: Form a photoresist layer on a target layer, where the photoresist layer includes a first part away from the target layer and a second part close to the target layer.

In some embodiments, referring to FIG. 4, the forming a photoresist layer 1 on a target layer 2 includes: coating the target layer 2 with a photoresist solution, where the photoresist solution includes two different photoresist compositions. In a pre-baking process, the two different photoresist compositions are layered on a top surface of the target layer 2, to form a first part 11 and a second part 12 of the photoresist layer 1 respectively.

In some embodiments, the formed photoresist layer 1 is a positive photoresist layer, and the first part 11 and the second part 12 of the photoresist layer 1 have different light refraction capabilities. In some embodiments, an optical refractive index of the second part 12 is greater than a refractive index of the first part 11.

Step S220: Process the photoresist layer by using a first process, such that a light absorption rate of the first part is less than a light absorption rate of the second part.

The processing manner of this embodiment is the same as that of step S120 in the foregoing embodiment. The first part 11 is processed by using the first process to reduce the concentration of a photo-acid generator in the first part 11, reduce the light absorption rate of the first part 11, and reduce the photosensitivity of the first part 11. In the first exposure processing, the processed first part 11 is used as a propagation medium for an incident beam to enter the second part 12.

Step S230: Perform first exposure processing on the photoresist layer to form an exposure image in the second part.

In some embodiments, as shown in FIG. 9, the first exposure processing is performed in an exposure apparatus 4, and the performing first exposure processing on the photoresist layer 1 includes:

Step S231: Adjust the exposure apparatus, such that a focal plane for imaging of the exposure apparatus is located in the second part.

Figure 10:
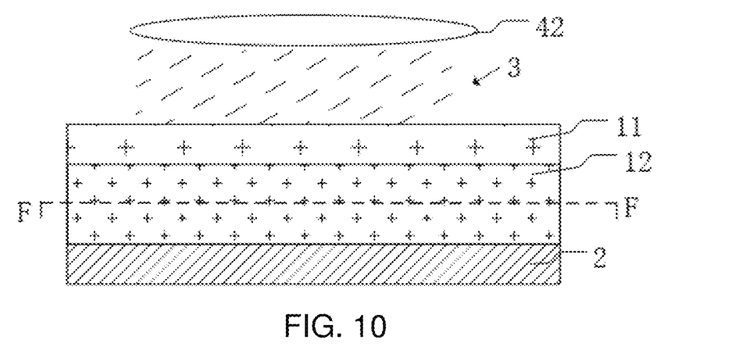
FIG. 10 is a schematic diagram of a focal plane of the exposure apparatus shown in FIG. 9.

As shown in FIG. 9, an exposure apparatus 4 is provided. The exposure apparatus 4 includes an exposure light source 41 and a projection lens 42. A mask plate 9 that includes a mask pattern is provided. The mask plate 9 is disposed between the exposure light source 41 and the projection lens 42. The photoresist layer 1 is disposed under the projection lens 42 of the exposure apparatus 4, and the exposure apparatus 4 is adjusted such that the projection lens 42 is aligned with the photoresist layer 1. As shown in FIG. 10, a focal plane F-F for imaging of the exposure apparatus 4 is adjusted, to ensure that the incident beam passing through the first part 11 can enter the second part 12 to form an exposure image 10 in the second part 12.

Referring to FIG. 9, a first medium 3 exists between the projection lens 42 and the photoresist layer 1, where the first medium 3 may be gas or liquid. When the first medium 3 is liquid, the projection lens 42 and the photoresist layer 1 are submerged in the first medium 3. For example, the first medium 3 may be air or water.

Step S232: Transmit a first incident beam having a first wavelength to the photoresist layer in a first medium, where the first incident beam is refracted by the first part and becomes a second incident beam having a second wavelength, and the second wavelength is less than the first wavelength.

In some embodiments, a refractive index of the first medium 3 is n1, a refractive index of the first part 11 of the photoresist layer 1 is n2, and a refractive index of the second part 12 is n3, where n1<n2<n3.

Light propagates in two propagation medium layers with different refractive indexes; a relationship between the wavelength and the refractive index is as follows:

$$\lambda 2 = \frac{\lambda 1 \times n1}{n2}.$$

Figure 11:
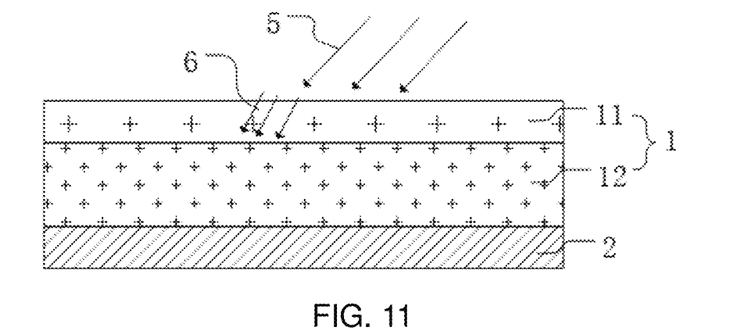
FIG. 11 is a schematic diagram of first exposure processing according to an exemplary embodiment.

As shown in FIG. 9 and FIG. 11, the exposure apparatus 4 transmits the first incident beam 5 to the photoresist layer 1. The first incident beam 5 enters the first part 11 from the first medium 3. After the first incident beam 5 is refracted by the first part 11, the wavelength is reduced, and the first incident beam 5 becomes the second incident beam 6. The first incident beam 5 has a wavelength λ1, and the second incident beam 6 has a wavelength λ2, where λ2<λ1.

Step S233: Transmit the second incident beam to the second part, and form the exposure image in the second part.

Figure 12:
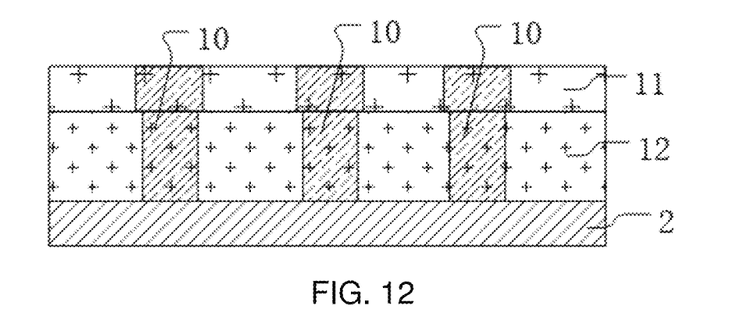
FIG. 12 is a schematic diagram of forming an exposure image in a second part according to an exemplary embodiment.

As shown in FIG. 12, the second incident beam 6 forms the exposure image 10 in the second part 12.

In the lithography process, lithographic resolution affects the quality of the exposure image. With higher lithographic resolution, the formed exposure image has higher precision. The lithographic resolution follows the Rayleigh formula:

$$R = k1 \frac{\lambda}{NA}$$

where R is a lithographic resolution; k1 is a process constant; λ is an exposure wavelength; NA is a numerical aperture (NA) of a projection lens for emitting the incident beam.

The lithographic resolution is used for representing a minimum achievable line width in the lithography process. According to the Rayleigh formula, a smaller wavelength of the incident optical wave and a smaller process constant can result in a smaller line width, that is, higher lithographic precision. In some embodiments, the first part 11 is used to reduce the wavelength of the incident beam entering the second part 12, to improve the precision of the exposure image 10 formed in the second part 12.

Step S240: Process the first part by using a second process.

The processing manner of this embodiment is the same as the processing manner of step S140 in the foregoing embodiment. The first part 11 processed by using the second process to improve the photosensitivity of the first part 11. Under light exposure, is unstable groups of the polymer resin in the first part 11 fall off more quickly, such that the polarity of the polymer resin in the first part 11 changes faster, to reduce the time for dissolving the first part 11 in the developing solution through photochemical reaction.

Step S250: Perform second exposure processing on the photoresist layer, to expose the first part that has been processed by the second process.

Figure 13:
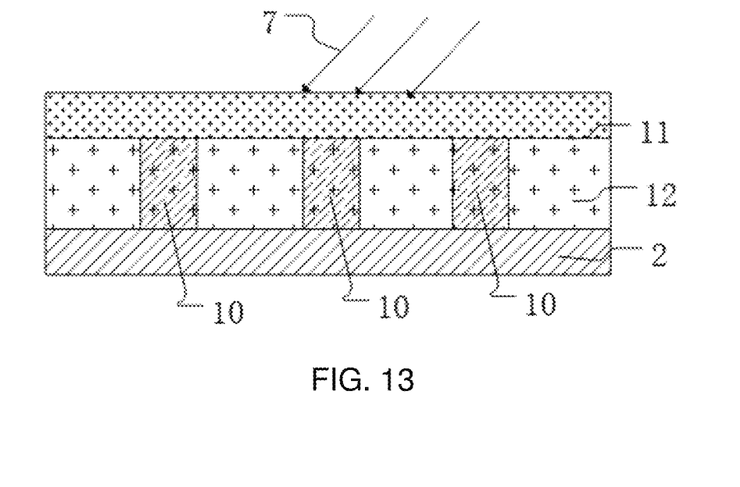
FIG. 13 is a schematic diagram of second exposure processing according to an exemplary embodiment.

As shown in FIG. 13 with reference to FIG. 12, the performing second exposure processing on the photoresist layer 1 includes: transmitting a third incident beam 7 to the photoresist layer 1, where the third incident beam 7 irradiates the surface of the first part 11, such that the entire first part 11 is under the exposure of the third incident beam 7; the polarity of the polymer resin in the first part 11 changes, such that the first part 11 is soluble in the developing agent.

In some embodiments, the light intensity of the third incident beam 7 is lower than that of the first incident beam 5, and the second exposure processing lasts a shorter period of time than the first exposure processing, such that the first part 11 is completely under the exposure of the third incident beam 7, while the second part 12 is not affected by the third incident beam 7.

Step S260: Perform development processing on the photoresist layer, to pattern the second part into a photoresist pattern.

Referring to FIG. 8 and FIG. 13, the performing development processing on the photoresist layer 1 includes: spraying a developing solution to the photoresist layer 1, such that the entire photoresist layer 1 is submerged in the developing solution, the first part 11 is completely dissolved in the developing solution, and a region where the exposure image 10 of the second part 12 is located is dissolved in the developing solution. The developing solution in which the photoresist layer 1 is dissolved and the excess developing solution are removed through cleaning, and the second part 12 not dissolved in the developing solution forms a photoresist pattern 8.

In some embodiments, after the development processing for the photoresist layer, the retained second part 12 is post-baked: hard baking is performed on the retained second part 12 at a temperature of 130° C. to 200° C. for 20 to 40 minutes, such that the solvent in the second part 12 completely escapes, and the second part 12 is further is polymerized, thus enhancing the etching resistance of the formed photoresist pattern 8.

In the method of processing a photoresist layer of this embodiment, during the first exposure processing, the focal plane for imaging is adjusted into the second part such that the formed exposure image is located in the second part, which improves the exposure efficiency. Moreover, in this embodiment, the first part is used to reduce the wavelength of optical waves entering the second part, thereby improving the lithographic resolution of the second part. The method of processing a photoresist layer of this embodiment can be used in an exposure process with a smaller lithographic critical dimension and more complex and diverse structures.

An exemplary embodiment of the present disclosure provides a photoresist layer covering a target layer 2. The photoresist layer 1 includes a first part 11 away from the target layer 2 and a second part 12 close to the target layer 2, and a light absorption rate of the first part 11 is less than a light absorption rate of the second part 12.

The photoresist layer of this embodiment reduces the light absorption rate of the first part 11, to allow a larger amount of incident beam to enter the second part 12 through the first part 11, thus improving the exposure efficiency of the incident beam in the second part 12.

According to an exemplary embodiment, referring to FIG. 4, the first part 11 of the photoresist layer 1 is configured to reduce a wavelength of optical waves entering the second part 12 of the photoresist layer 1 from a first medium 3.

In the photoresist layer of this embodiment, the first part 11 is used as a propagation medium for the incident beam to enter the second part 12. The first part 11 reduces the wavelength of the incident beam entering the second part 12, so as to improve the lithographic resolution of the second part 12.

According to an exemplary embodiment, referring to FIG. 4, a refractive index n2 of the first part 11 of the photoresist layer 1 is greater than a refractive index n1 of the first medium, and less than a refractive index n3 of the second part 12 of the photoresist layer 1. For example, when the first medium 3 is air, the refractive index n2 of the first part 11 is greater than 1, and when the first medium 3 is water, the refractive index n2 of the first part 11 is greater than 1.44.

In the photoresist layer of this embodiment, a propagation medium layer with a refractive index gradually increasing from the first medium 3 to the second part 12 is formed on a light transmission path of the incident beam to the second part 12, which further improves the lithographic resolution of the photoresist layer. The photoresist pattern formed in the second part 12 has higher precision and quality.

According to an exemplary embodiment, referring to FIG. 4, the photoresist layer 1 is a positive photoresist layer.

In this embodiment, the photoresist layer 1 is a positive photoresist layer. The photosensitivity of the first part 11 can be improved by processing the first part 11, and then the first part 11 is removed through exposure and development processing, while only the second part 12 is retained to form the photoresist pattern, thus avoiding the first part 11 from affecting the top shape of the photoresist pattern.

According to an exemplary embodiment, a thickness of the first part 11 is greater than 1/10 of a wavelength of an incident beam entering the photoresist layer 1 from the first medium 3. For example, the optical wavelength of the lithography equipment includes, but is not limited to, G-line (436 nm), I-line (365 nm), KrF (248 nm), ArF (193 nm), and extreme ultraviolet (EUV) (13.5 nm). Correspondingly, for example, when KrF lithography equipment is used, the thickness of the first part 11 may be greater than 24.8 nm; when ArF lithography equipment is used, the thickness of the first part 11 may be greater than 19.3 nm; when EUV lithography equipment is used, the thickness of the first part 11 may be greater than 1.35 nm.

In some embodiments, the thickness of the first part 11 is less than 1/5 of a thickness of the second part 12, which reduces the difficulty of stripping the first part 11 while ensuring that the thickness of the second part 12 satisfies the etching requirement.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Although the steps in the flowcharts of FIG. 1 to FIG. 3 are sequentially connected, these steps are not necessarily performed in the order of the connection. The execution order of the steps is not strictly limited, and the steps may be executed in other orders, is unless clearly described otherwise. Moreover, at least some of the steps in FIG. 1 to FIG. 3 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of processing a photoresist layer and a photoresist layer provided by the embodiments of the present disclosure, the first part is removed after the exposure image is formed in the second part, to avoid the problem of undesired top shape of the photoresist pattern due to the presence of the first part.

The invention claimed is:

1. A method of processing a photoresist layer, comprising:
    forming a photoresist layer on a target layer, wherein the photoresist layer comprises a first part away from the target layer and a second part close to the target layer;
    processing the photoresist layer by using a first process, such that a light absorption rate of the first part is less than a light absorption rate of the second part;
    performing first exposure processing on the photoresist layer, and forming an exposure image in the second part; and
    stripping the first part and performing first development processing on the photoresist layer, to pattern the second part into a photoresist pattern.

2. The method of processing a photoresist layer according to claim 1, wherein the processing the photoresist layer by using a first process, such that a light absorption rate of the first part is less than a light absorption rate of the second part comprises:
    processing the first part by using the first process, wherein a photo-acid generator in the first part is reacted to form a photo-acid product, and the processed first part has a lower concentration of the photo-acid generator than the second part.

3. The method of processing a photoresist layer according to claim 2, wherein the processing the first part by using the first process comprises:
    implanting amino ions into the first part from a top surface of the photoresist layer, wherein an implantation depth of the amino ions is a first depth, and the first depth is equal to a thickness of the first part.

4. The method of processing a photoresist layer according to claim 2, wherein the processing the first part by using the first process comprises:
    spraying an alkaline gas to a top surface of the photoresist layer, such that the photo-acid generator in the first part reacts with the alkaline gas to generate the photo-acid product.

5. The method of processing a photoresist layer according to claim 1, wherein the processing the photoresist layer by using a first process, such that a light absorption rate of the first part is less than a light absorption rate of the second part comprises:
    heating the target layer, and heating the photoresist layer through the target layer, such that a temperature of the second part is higher than a temperature of the first part.

6. The method of processing a photoresist layer according to claim 2, wherein the stripping the first part comprises:
    processing the first part by using a second process, and stripping the first part that has been processed by the second process.

7. The method of processing a photoresist layer according to claim 6, wherein the processing the first part by using a second process comprises:
    implanting hydrogen ions into the photoresist layer from a top surface of the photoresist layer, wherein an implantation depth of the hydrogen ions is a second depth, and the second depth is equal to a thickness of the first part.

8. The method of processing a photoresist layer according to claim 6, wherein the processing the first part by using a second process comprises:
    spraying an acid gas to a top surface of the photoresist layer, wherein the acid gas reduces the photo-acid product in the first part to be the photo-acid generator.

9. The method of processing a photoresist layer according to claim 6, wherein the stripping the first part that has been processed by the second process comprises:
    performing second exposure processing on the photoresist layer, to expose the first part that has been processed by the second process; and
    performing second development processing on the photoresist layer, to strip the exposed first part.

10. The method of processing a photoresist layer according to claim 1, wherein the first exposure processing is performed in an exposure apparatus, and the performing first exposure processing on the photoresist layer comprises:
    adjusting the exposure apparatus, such that a focal plane for imaging of the exposure apparatus is located in the second part.

11. The method of processing a photoresist layer according to claim 1, wherein the performing first exposure processing on the photoresist layer comprises:
    transmitting a first incident beam having a first wavelength to the photoresist layer in a first medium, wherein the first incident beam is refracted by the first part and becomes a second incident beam having a second wavelength, and the second wavelength is less than the first wavelength; and
    transmitting the second incident beam to the second part, and forming the exposure image in the second part.

12. A photoresist layer, covering a target layer, wherein the photoresist layer comprises a first part away from the target layer and a second part close to the target layer, and a light absorption rate of the first part is less than a light absorption rate of the second part.

13. The photoresist layer according to claim 12, wherein the first part of the photoresist layer is configured to reduce a wavelength of optical waves entering the second part of the photoresist layer from a first medium.

14. The photoresist layer according to claim 13, wherein a refractive index of the first part of the photoresist layer is greater than a refractive index of the first medium and less than a refractive index of the second part of the photoresist layer.

15. The photoresist layer according to claim 12, wherein the photoresist layer is a positive photoresist layer.

16. The photoresist layer according to claim 12, wherein the second part has a higher concentration of a metal oxide than the first part.

\* \* \* \* \*